United States Patent [19]
Kolberg et al.

[11] Patent Number: 5,526,232
[45] Date of Patent: Jun. 11, 1996

[54] CONTROL DEVICE

[75] Inventors: Gerhard Kolberg, Buchl; Juergen Koelmel, Rastatt; Thomas Fabry, Neckartenzlingen; Peter Kusserow, Sonnenbuehl, all of Germany

[73] Assignee: Robert Bosch GmbH, Stuttgart, United Kingdom

[21] Appl. No.: 345,309

[22] Filed: Nov. 28, 1994

[30] Foreign Application Priority Data

Dec. 16, 1993 [DE] Germany ................ 43 42 978.5

[51] Int. Cl.⁶ .................................... H05K 7/20
[52] U.S. Cl. .................................... 361/715; 439/487
[58] Field of Search ................ 174/35 R, 35 C; 361/704, 707, 709–711, 715–716, 719–722, 728, 730, 752–753, 758, 781, 816, 818; 439/607–610, 108–109, 485, 487

[56] References Cited

U.S. PATENT DOCUMENTS

| | | | |
|---|---|---|---|
| 5,130,896 | 7/1992 | Babb et al. | 174/35 C |
| 5,280,412 | 1/1994 | Podell et al. | 361/710 |
| 5,311,408 | 5/1994 | Ferchau et al. | 174/35 C |
| 5,353,202 | 10/1994 | Ansell et al. | 174/35 C |

FOREIGN PATENT DOCUMENTS

| | | | |
|---|---|---|---|
| 3331207 | 3/1985 | Germany | 361/709 |
| 9114820 | 11/1991 | Germany . | |

*Primary Examiner*—Gregory D. Thompson
*Attorney, Agent, or Firm*—Michael J. Striker

[57] ABSTRACT

A control device, in particular for motor vehicles has a metal housing, a printed board provided with a circuit and surrounded at least partially by the metal housing, a plug connection having a plug insert with at least one plug contact connected with the printed board, and a metal casing which at least partially surrounds the plug insert. The casing extending substantially inside the housing close to the printed board.

13 Claims, 3 Drawing Sheets

CONTROL DEVICE

BACKGROUND OF THE INVENTION

The present invention relates generally to a control device.

More particularly, it relates to a control device for motor vehicles with a printed board having a circuit and arranged in a housing.

Control devices of the above mentioned general type are known in the art. One such control device is disclosed for example in the German document DE-U 91 14 820. This control device is provided in particular for motor vehicles, and a metal housing accommodates at least partially the printed board with a circuit. A further metal housing is located inside the main housing and surrounds a part of the printed board for screening against HF-radiation. The metallic housing prevents exiting electromagnetic radiation which is caused by electrical equipments of the printed board from the control device, which can disturb the operation of other control devices or electrical equipments. It is not disclosed in this control device how it is connected with other parts, for example with an electrical unit to be controlled by the control device. It is however generally conventional to provide a plug connection on the control device. However, in the region of the plug connection there is no screening of the electromagnetic radiation.

SUMMARY OF THE INVENTION

Accordingly, it is an object of the present invention to provide a control device of the above mentioned general type, which avoids the disadvantages of the prior art.

In keeping with these objects and with others which will become apparent hereinafter, one feature of the present invention resides, briefly stated, in a control device on which a plug connection is provided and has a plug insert with at least one plug contact which is connected with the printed board, and one of the plug inserts has at least partially surrounding metallic casing, while the casing extends substantially inside the housing and close to the printed board.

When the control device is designed in accordance with the present invention it eliminates the disadvantages of the prior art. In particular, the metallic casing of the plug connection which extends to the vicinity of the printed board provides an efficient screening of the electromagnetic radiation.

In accordance with another feature of the present invention, the outer surface of the casing is provided with at least one electrical power component connected with the printed board inside the housing. In this construction the casing of the plug connection can serve simultaneously as a cooling body for withdrawal of heat produced in the power components.

In accordance with further features of the present invention, the electrical power component has at least one connecting leg for connection with the printed board and the connecting leg is guided in a recess formed in a structural element held on the casing. This structural element can be the plug insert provided with a flange which laterally extends beyond the casing and has at least one opening which operates as the receptacle and through which the connecting leg extends. In this construction the connecting feet guide the power components and they are protected during the connection with the printed board from bending and other deformations or damages.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
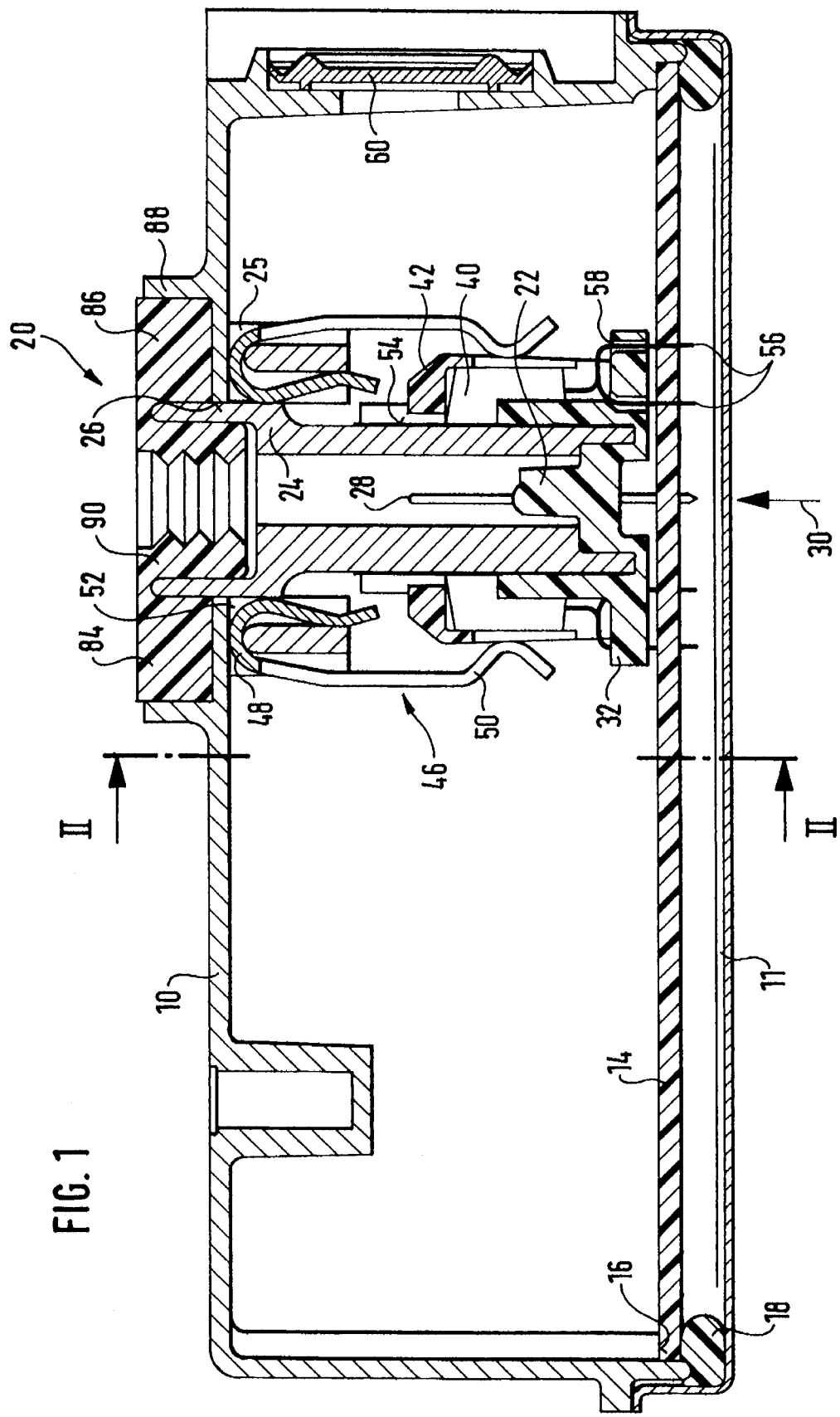
FIG. 1 is a view showing a section of a control device in accordance with the present invention taken along line I—I in FIG. 2.
Figure 2:
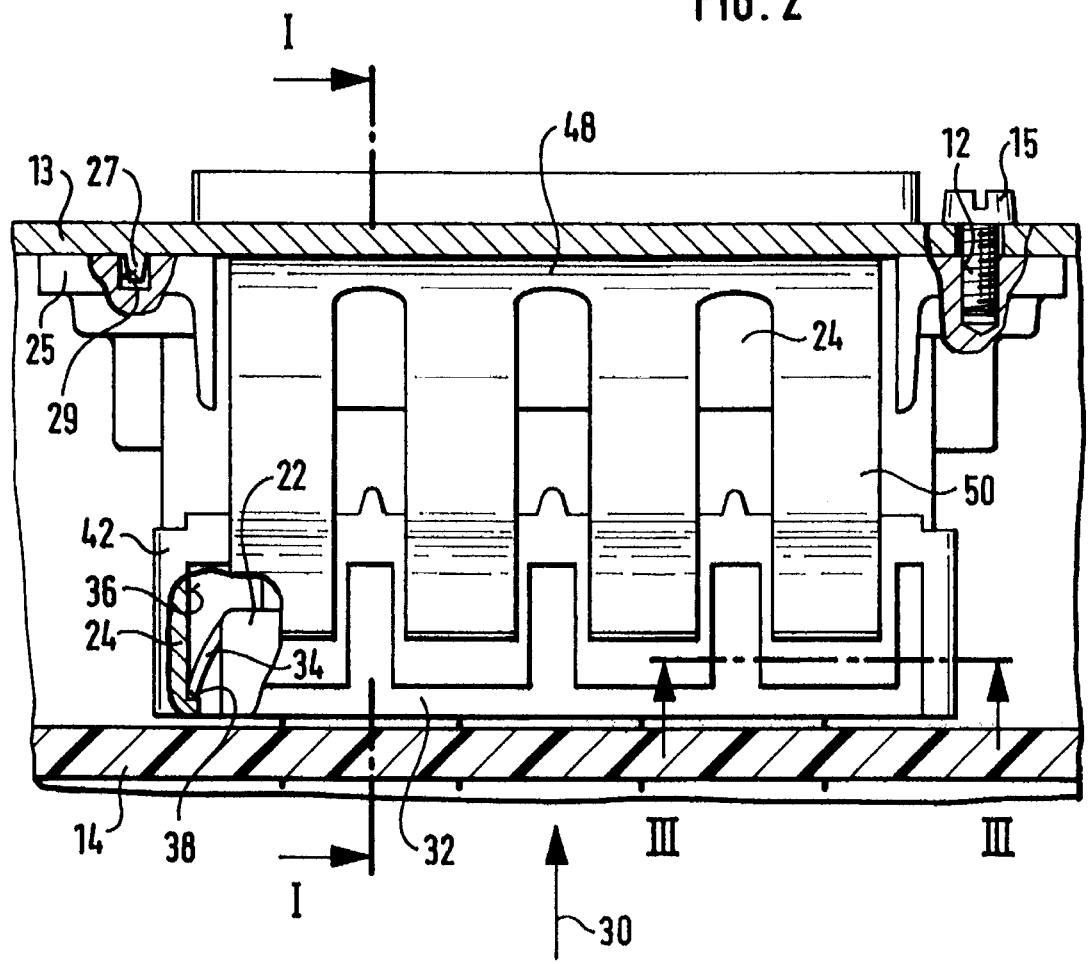
FIG. 2 is a view showing the inventive control device in a section taken along the line II—II in FIG. 1.
Figure 3:
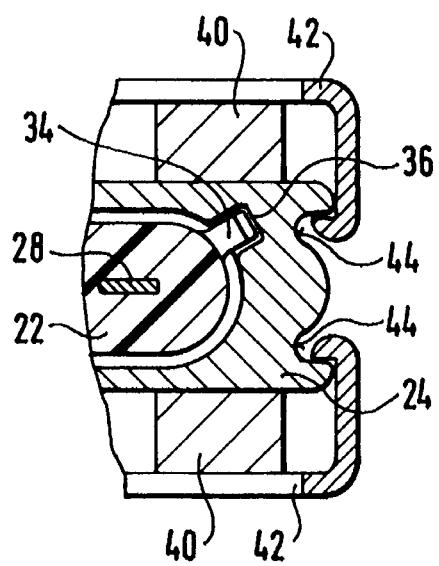
FIG. 3 is a view showing the inventive control device in a section taken along the line III—III in FIG. 2.
Figure 4:
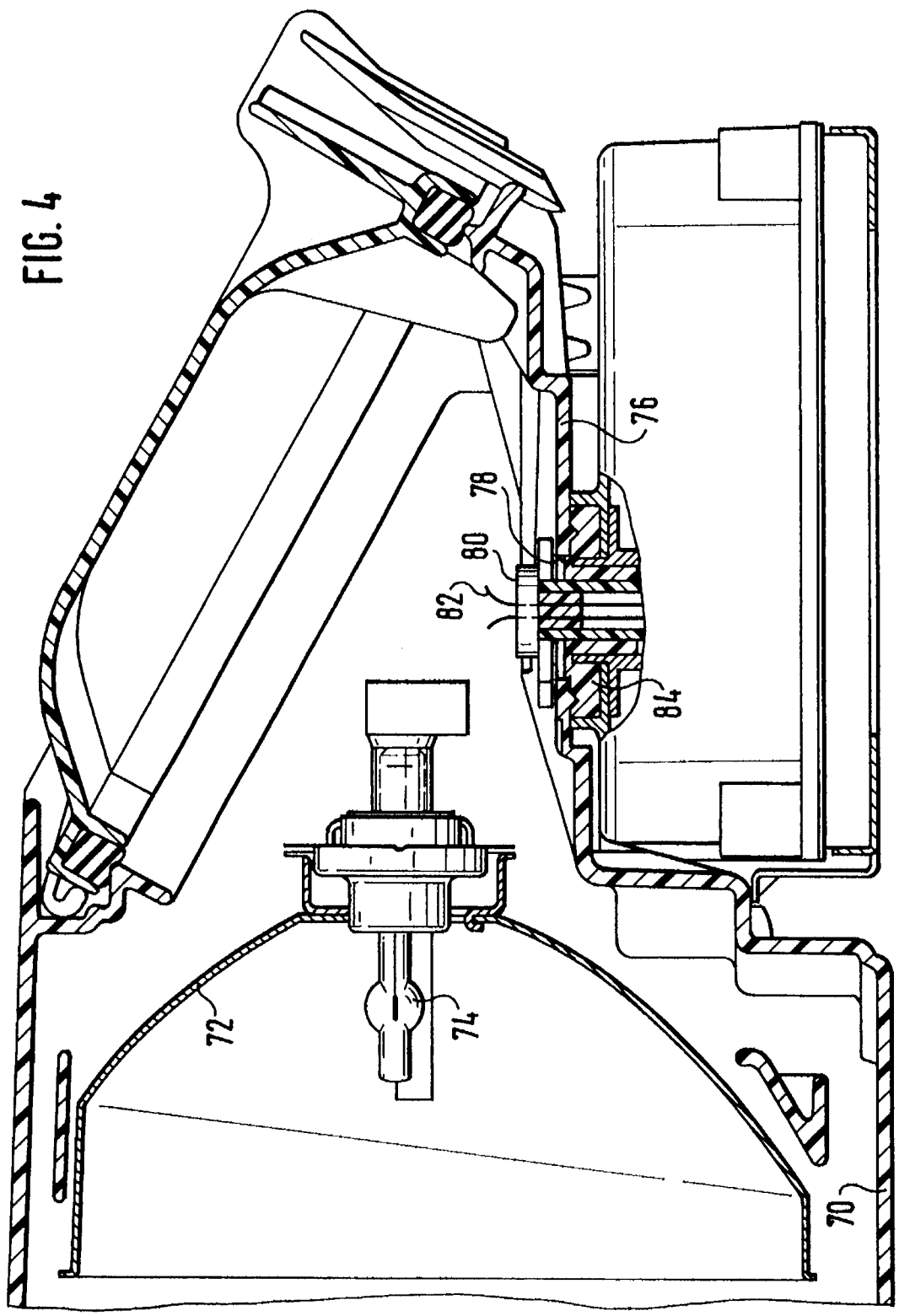
FIG. 4 is a vehicle headlight with the inventive control device mounted in it.

FIGS. 1–3 show a control device which is provided for electrical equipment, in particular for motor vehicles. The control device is utilized for example for a motor vehicle head lamp which has a gas discharge lamp as a light source an operates to insure a reliable ignition and a stable operation of the gas discharge lamp. The control device has a housing which is composed of metal and assembled of two parts 10 and 11. For example, the housing can be composed of light metal cast. The housing part 10 is trough-shaped while the housing part 11 is formed as a cover closing the housing part 10. A printed board 14 is arranged in the housing of the control device and carries an electrical circuit. Several ribs 16 are distributed over the periphery of the housing part 10, and the printed board 14 is held between the ribs and the cover 11. A circumferential bead 18 is provided on the inner side of the cover 11 and composed of an elastic sealing material. The printed board 14 is located on the bead 18 so that on the one hand a sealing of the housing is provided and on the other hand, a gap-free arrangement of the printed board 14 in the housing is guaranteed. Both housing parts 10 and 11 are connected with one another for example by not shown screws.

A plug connection 20 is provided on the control device, and a plug can be inserted into the plug connection 20 for connecting the control device with the electrical equipment supplied by the same. The plug connection 20 extends on the control device substantially perpendicular to the printed board 14. The plug connection 20 has a plug insert 22 and a casing 24 which partially surrounds the plug insert and is composed of metal. The casing 24 is produced, similarly to the housing parts 10, 11, from light metal cast and arranged inside the housing. The housing part 10 has an opening 26 provided for the plug connection 20 in a wall 13 located opposite to the printed board 14. The casing 24 has a flange 25 at its end which faces away from the printed board 14 and abuts with this flange against the wall 13 of the housing part 10 which surrounds the opening 26 on its inner side. The end of the casing 24 extends through the opening 26 substantially outwardly, and the plug part is inserted in it. As shown in FIG. 2, one or several threaded openings 12 are provided in the flange 25 so that screws 15 can be screwed into them through the openings in the wall 13 for holding the casing 24 on the housing part 10. One or several projections 27 extend from the inner side of the wall 13 and engage in corresponding recesses 29 in the flange 25 to exactly position the casing 24 and to provide insertion into the housing part 10 only in one position.

The plug insert 22 is composed of synthetic plastic material and assembled with one or several plug contacts 28 as a multiple plug which are connected with a circuit on the printed board 14. The plug contacts 28 are arranged in series near one another, so that the plug insert 22 and correspondingly also the casing 24 has a greater extension in the direction in which the plug contacts 28 are arranged near one another than in a transverse direction. The plug insert 22 is insertable into the casing 24 in direction of the arrow 30 and held in its end position for example by an arresting connection. The plug insert 22 has a flange 32 which is greater than the free cross-section of the casing 24 and comes to abutment with this flange 32 in its end position against the end of the casing 24 which faces the printed board 14. The plug insert 22 in the shown embodiment has two springy movable arms 34 extending transverse to the insertion direction 30, while the casing 24 has two recesses 36 provided for the arms 34 and extending in the inserting direction 30 of the plug insert 22. Only one arm 34 with the associated recess 36 are shown in FIGS. 2 and 3, while the other arm 34 and the associated recess 36 are arranged at the other end of the plug insert 22 and the casing 24. At the end which is opposite to the insertion direction 30, a step 38 is formed on the recesses 36 and faces inwardly of the casing 24. The arms 34 of the plug insert 22 face with their free ends opposite to the insertion direction 30. During the insertion of the plug insert 22 in the casing 24, the arms 34 are turned in a springy manner inwardly of the casing 24, and in the end position of the plug insert 22 they turn outwardly and are arrested behind the step 38.

The above mentioned feature that the casing 24 at least partially surrounds the plug insert 22 concretely means that the casing 24 is completely closed over its periphery and extends from the wall 13 of the housing part 10 to the vicinity of the printed board 14. However, between the printed board 14 and the end of the casing 24 a distance is provided by the flange 32 of the plug insert 22.

The control device has furthermore electrical power components 40, such as for example transistors which are connected with the circuit on the printed board 14. The power components 40 are arranged on both wide sides of the casing 24, and a holding element 42 is provided on each wide side for holding the power components 40 in a predetermined position. It is also possible to arrange the power components 40 only on one wide side of the casing 24 so that correspondingly only one holding element 42 is provided. The holding element 42 is composed of synthetic plastic material and is bracket shaped. Its lateral ends as shown in FIG. 3 engage in grooves 44 in the small sides of the casing 24 and the central region extends over the wide side of the casing 24. The grooves 44 are open toward the end of the casing 24 which faces the printed board 14, and when the plug insert 22 is mounted are closed by its flange 32. The holding element 42 has several portions located in its central region, in which correspondingly a power component 40 is arranged.

The power components 40 are pressed by a springy element 46 against the wide side of the casing 24. The spring element 46 in the shown example is a metal spring which is bent at its end 48 to be U-shaped and is provided at its other end with several free spring arms 50 extending substantially parallel to the wide side of the casing 24. A slot 52 is formed on the flange 25 of the casing 24, and the U-shaped end 48 of the metal spring 46 is suspended here by the wall 13 of the housing part 10 as a bracket. Its spring arms 50 face toward the printed board 14. In the shown embodiment in FIG. 2 each spring arm 50 is associated with the corresponding power component 40 and all extend from the U-shaped end 48. The spring arms 50 engage over the holding element 42 on the components 40 and press the same against the outer surface of the casing 24. An electrically insulating and heat conductive layer 54 formed for example as a foil is arranged between the power components 40 and the outer surface of the casing 24.

The power components 40 are provided with connection legs 56 for connecting with the circuit of a printed board 14. The flange 32 of the plug insert 22 which extends beyond the casing 24 has several openings 58. The connection legs 56 of the power components 40 extend through the openings 58 with a small gap. The connection legs 56 are guided thereby in the openings 58.

The mounting of the control device in accordance with the present invention is explained hereinbelow. First, the insulating foil 54 is applied on the outer surface of the casing 24 of the plug connection 20. Then the plug insert 22 is inserted into the casing 24 in the direction of the arrow 30 until its flange 32 abuts against the end of the casing 24. The plug insert 22 is held in the casing 24 by the arms 34 engaging with the step 38. The components 40 are inserted then with their legs 56 through the openings 58 in the flange 32 of the plug insert 22 so that in the end position they extend through the flange 32 toward the printed board 14. The holding element 42 is fitted over the power components 40, and its bracket is somewhat springy bent for insertion in the grooves 44. The grooves 44 are closed by the flange 32 so that the holding element 42 cannot displace from the grooves 44 toward the printed board 14. Finally, the metal spring 46 is inserted with its U-shaped end 48 into the slot 52 in the flange 25 of the casing 24 and slides with its spring arms 50 under elastic deformation on the holding element 42. Therefore the power components 40 are pressed with interposition of the holding element 42 and pre-stressed against the outer surface of the casing 24.

The above described mounted parts form together a pre-mounting unit which is subsequently connected with the printed board 14. For this purpose the plug contacts 28 and the connection legs 56 of the power components 40 are connected with the circuit of the printed board 14. The connection legs 56 and the legs of the plug contact 28 extending from the plug insert 33 toward the printed board 14 are soldered with the printed board 14. The connection legs 56 are guided in the openings 58 in the flange 32 so that they cannot be bent or damaged in any other way.

The plug connection 20 and the printed board 14 are subsequently inserted into the housing part 10, and the casing 24 with its flange 25 comes to abutment against the inner side of the housing wall 13 while the printed board 14 comes to abutment against the ribs 16. The casing, as described hereinabove, is then mounted by screws 15 which extend from outside of the housing 10 into the threaded openings 12 in the flange 25. Finally, the cover 11 is placed is placed and the sealing bid 18 abuts against the printed board 14 to hold it in abutment against the ribs step 16. Finally, the housing part 10 and the cover 11 are connected with one another.

The housing 10, 11 of the control device is also provided with a pressure compensating element 60 in a known manner. With the use of the pressure compensating element a pressure compensation is provided between the interior of the housing 10, 11 and the outer area during heating or cooling of the control device.

As explained hereinabove, the control device is provided for a motor vehicle headlight shown in FIG. 3 and having a gas discharge lamp. The headlight has a housing 70 with a reflector 72 arranged in it, while the gas discharge lamp 74 is inserted in the reflector. The control device is mounted on the outer side of the headlight housing 70, for example by screws or other means. The headlight 70 has a opening 78 provided in its wall 76 and arranged in the region of the plug connection 20. A plug part 80 is arranged inside the headlight housing 70 and connected through conductors 82 with the gas discharge lamp 74 with interposition of a not shown ignition device. The plug part 80 is inserted through the opening 78 into the casing 24. The housing part 10 is arranged with its wall 13 at a small distance relative to the wall 76 of the headlight housing 70, and an elastic sealing element 84 is clamped between the walls 13 and 76. The sealing element 84 has an outer portion 86 which surrounds the opening 78 and the end of the casing 24 which extends through the wall 13. The wall 13 is provided with a collar 88 which faces the wall 76, and the outer portion 86 of the sealing element 84 arranged inside the collar. The outer portion 86 of the sealing element 84 serves for sealing between the control device housing and the headlight housing 70. Further, the sealing element 84 has an inner portion 90 which extends into the casing 24 and provides a sealing of the plug connection, or in other words between the plug part 80 and the casing 24.

It will be understood that each of the elements described above, or two or more together, may also find a useful application in other types of constructions differing from the types described above.

While the invention has been illustrated and described as embodied in a control device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A control device, in particular for motor vehicles, comprising a metal housing; a printed board provided with a circuit and surrounded by said metal housing; a plug connection having a plug insert with at least one plug contact connected with said printed board; and a metal casing which at least partially surrounds said plug insert, said casing extending substantially inside said housing and close to said printed board, said casing having an outer surface which carries at least one electrical power component connected with said printed board and arranged inside said housing.

2. A control device as defined in claim 1, wherein said casing of said plug connection is formed as a separate element which is inserted in said housing.

3. A control device as defined in claim 1, wherein said casing has a completely closed periphery.

4. A control device as defined in claim 1, wherein said plug insert has a flange provided at an end of said casing which faces said printed board and extending laterally beyond said casing, said flange being located between the end of said casing and said printed board.

5. A control device as defined in claim 1; and further comprising a holding element in which said power component is held and positioned, said holding element being fixed on said casing.

6. A control device as defined in claim 1; and further comprising a spring element which holds said power component in abutment against said outer surface of said casing.

7. A control device as defined in claim 6, wherein said spring element is formed as a flat spring with one end which is bent in a U-shaped manner and suspended on said casing and another end which forms a free spring arm and engages in said power component.

8. A control device as defined in claim 7; and further comprising a holding element arranged so that said free spring arm engages on said power component through said holding element.

9. A control device as defined in claim 1; and further comprising an electrically insulating and heat conductive layer provided between said power component and said outer surface of said casing.

10. A control device as defined in claim 1, wherein said electrical power component has at least one connection leg for connecting with said printed board, said casing holding an element which is provided with a recess for said connection leg.

11. A control device as defined in claim 10, wherein said plug insert has a flange extending laterally outwardly beyond said casing and provided with an opening which forms a receptacle through which said connection leg extends.

12. A control device as defined in claim 1; and further comprising means forming an arresting connection for holding said plug insert in said casing.

13. A control device, in particular for motor vehicles, comprising a metal housing; a printed board provided with a circuit and surrounded by said metal housing; a plug connection having a plug insert with at least one plug contact connected with said printed board; and a metal casing which at least partially surrounds said plug insert, said casing extending substantially inside said housing and close to said printed board, said plug insert having a flange provided at an end of said casing which faces said printed board and extending laterally beyond said casing, said flange being located between the end of said casing and said printed board.

* * * * *